US011201122B2

(12) United States Patent
Yen et al.

(10) Patent No.: US 11,201,122 B2
(45) Date of Patent: Dec. 14, 2021

(54) METHOD OF FABRICATING SEMICONDUCTOR DEVICE WITH REDUCED WARPAGE AND BETTER TRENCH FILLING PERFORMANCE

(71) Applicant: Taiwan Semiconductor Manufacturing Co., Ltd., Hsin-Chu (TW)

(72) Inventors: Chun-Hsu Yen, Hsinchu (TW); Yu Chuan Hsu, Hsinchu (TW); Chen-Hui Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/270,477

(22) Filed: Feb. 7, 2019

(65) Prior Publication Data

US 2020/0105683 A1 Apr. 2, 2020

Related U.S. Application Data

(60) Provisional application No. 62/737,262, filed on Sep. 27, 2018.

(51) Int. Cl.
*H01L 21/02* (2006.01)
*H01L 21/3105* (2006.01)
(Continued)

(52) U.S. Cl.
CPC ........ *H01L 23/562* (2013.01); *H01L 21/0217* (2013.01); *H01L 21/02164* (2013.01);
(Continued)

(58) Field of Classification Search
CPC .......................... H01L 21/02; H01L 21/3105
See application file for complete search history.

(56) References Cited

U.S. PATENT DOCUMENTS 6,297,128 B1 10/2001 Kim et al.
7,229,896 B2 6/2007 Chen et al.
(Continued)

FOREIGN PATENT DOCUMENTS

EP 0657925 A1 6/1995
KR 20040060919 A 7/2004
(Continued)

OTHER PUBLICATIONS

"Spin/Bake/Cure Procedures for Spin-On-Glass Materials: For Interlevel and Intermetal Dielectric Planarization", 2000, Honeywell International Inc., Honeywell Electronics Materials Interconnect Solutions https://www.nanotech.ucsb.edu/wiki/images/c/c4/512B-Application-Data-Bake-revA.pdf.

*Primary Examiner* — Kenneth Parker
*Assistant Examiner* — Long H Le
(74) *Attorney, Agent, or Firm* — Haynes and Boone, LLP

(57) ABSTRACT

A trench is formed through a plurality of layers that are disposed over a first substrate. A first deposition process is performed to at least partially fill the trench with a first dielectric layer. The first dielectric layer delivers a tensile stress. A second deposition process is performed to form a second dielectric layer over the first dielectric layer. A third deposition process is performed to form a third dielectric layer over the second dielectric layer. The third dielectric layer delivers a first compressive stress.

20 Claims, 13 Drawing Sheets

(51) Int. Cl.
  *H01L 23/00* (2006.01)
  *H01L 21/683* (2006.01)
  *H01L 21/311* (2006.01)

(52) U.S. Cl.
  CPC .. *H01L 21/02274* (2013.01); *H01L 21/02282* (2013.01); *H01L 21/02356* (2013.01); *H01L 21/31053* (2013.01); *H01L 21/31111* (2013.01); *H01L 21/6835* (2013.01)

(56) References Cited

U.S. PATENT DOCUMENTS

| | | | |
|---|---|---|---|
| 7,442,621 B2 | 10/2008 | Orlowski et al. | |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 2003/0038344 A1 | 2/2003 | Palmer et al. | |
| 2006/0121688 A1 | 6/2006 | Ko et al. | |
| 2007/0190715 A1 | 8/2007 | Ohta | |
| 2009/0098740 A1* | 4/2009 | Kim | H01L 21/76232 438/782 |
| 2010/0006975 A1* | 1/2010 | Ang | H01L 21/76224 257/510 |
| 2012/0025389 A1 | 2/2012 | Chu et al. | |
| 2014/0001645 A1 | 1/2014 | Lin et al. | |
| 2014/0225258 A1 | 8/2014 | Chiu et al. | |
| 2014/0252572 A1 | 9/2014 | Hou et al. | |
| 2015/0279925 A1* | 10/2015 | Breil | H01L 27/10867 257/534 |
| 2017/0047338 A1 | 2/2017 | Shinohara et al. | |

FOREIGN PATENT DOCUMENTS

| | | |
|---|---|---|
| TW | I270165 | 1/2007 |
| TW | I278960 B | 4/2007 |
| TW | 201330103 A | 7/2013 |

\* cited by examiner

METHOD OF FABRICATING SEMICONDUCTOR DEVICE WITH REDUCED WARPAGE AND BETTER TRENCH FILLING PERFORMANCE

PRIORITY DATA

The present application is a utility patent application of U.S. provisional patent application No. 62/737,262, filed on Sep. 27, 2018, entitled "Method of Fabricating Semiconductor Device with Reduced Warpage and Better Trench Filling Performance", the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, as the scaling down in semiconductor fabrication continues, various challenges may arise. For example, semiconductor fabrication may involve filling trenches with a high aspect ratio (e.g., an aspect ratio greater than or equal to 10:1), which may be difficult to perform as the semiconductor device sizes (and consequently the trench dimensions) get smaller and smaller. As another example, semiconductor fabrication may involve processes for bonding different wafers together. However, a warpage of the wafer (which may be at least partially induced by films that deliver a tensile stress) may lead to bonding metal cracks. This problem may be further exacerbated by the scaling down in semiconductor fabrication, since the bonding area is getting smaller.

Therefore, while existing semiconductor fabrication methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
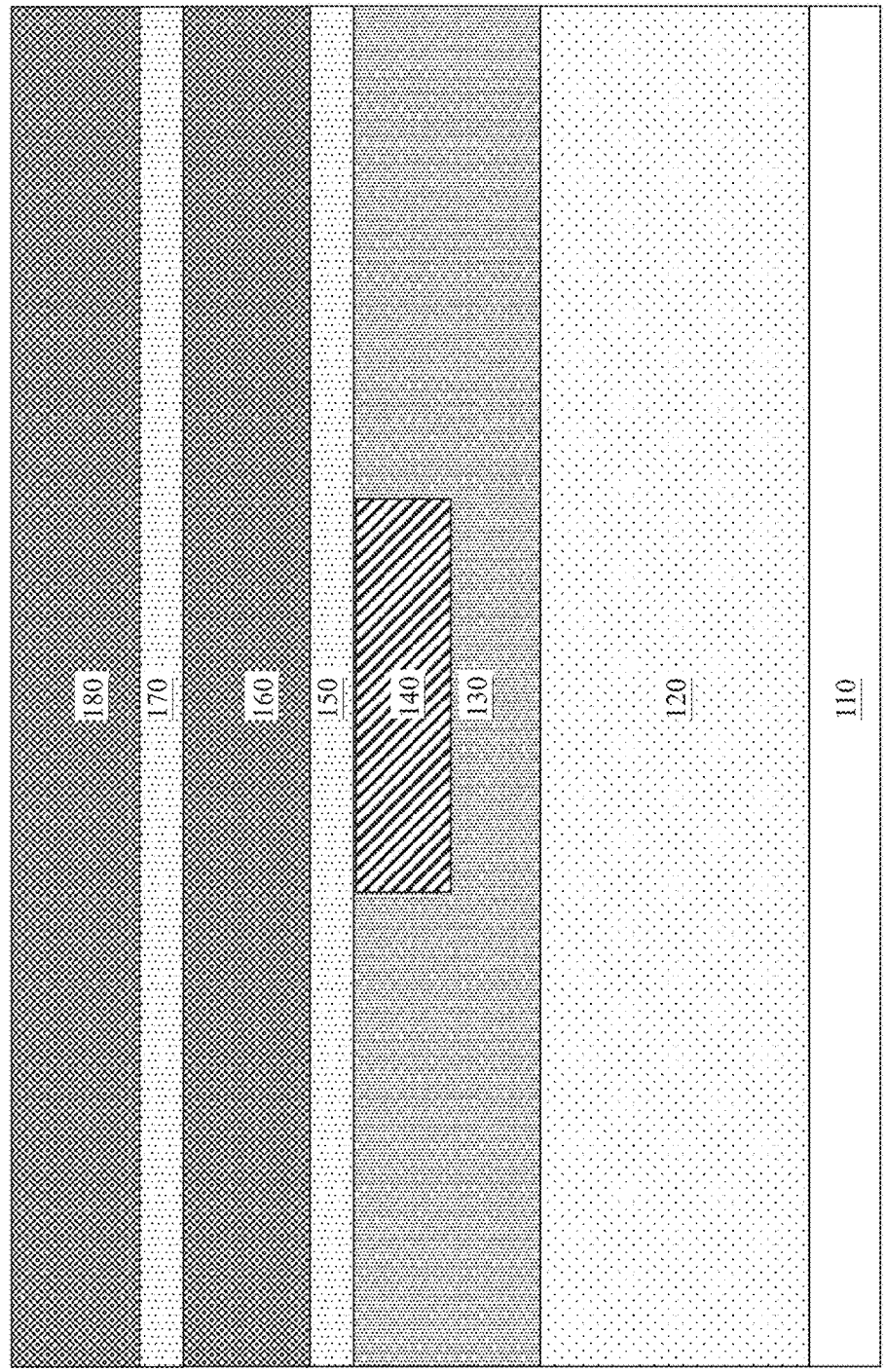
FIGS. 1-12 illustrate diagrammatic fragmentary cross-sectional views of a semiconductor device at various stages of fabrication according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purposes of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Rapid advancements in the semiconductor industry have led to advancements in fabrication methods and processes. However, despite these advancements, existing semiconductor fabrication may still have various shortcomings. For example, existing semiconductor fabrication may involve forming a deep trench with a high aspect ratio (e.g., greater than about 10) and filling the deep trench with a material. Due to the high aspect ratio, as well as the increasingly small device sizes, it may be difficult to fill such a deep trench without gaps or voids being trapped therein. These gaps/voids may lead to problems in later fabrication processes and may degrade device performance. As another example, existing semiconductor fabrication may involve bonding different wafers together, for example bonding a device wafer with a carrier wafer. However, any warpage in the device wafer (which could be caused by tensile stress delivered by its films) may lead to cracks at or near the bonding area. In some cases, the films that deliver tensile stress may be the films used by existing fabrication methods to fill the deep trenches. These cracks in the bonding area may degrade device performance or even cause device failures.

To overcome the problems of existing semiconductor fabrication processes, the present disclosure proposes a novel scheme involving multiple material layers, so as to more effectively fill deep trenches substantially without gaps/voids being trapped therein, which improves device performance. The novel scheme also introduces a compressive stress to compensate for the tensile stress. The compressive stress substantially cancels out the tensile stress and therefore reduces or eliminated wafer warpage. As a result, bonding crack issues are substantially eliminated, again improving device performance. The various aspects of the present disclosure are discussed below with reference to FIGS. 1-12, which are diagrammatic fragmentary cross-sectional side views of a semiconductor device 100 at various stages of fabrication according to embodiments of the present disclosure. In some embodiments, the semiconductor device 100 may include two dimensional or planar transistors. In other embodiments, the semiconductor device 100 may include three dimensional FinFET transistors where the gate structures are wrapped around one or more fin structures.

Referring now to FIG. 1, the semiconductor device 100 includes a substrate 110. In some embodiments, the substrate 110 contains a silicon material doped with a p-type dopant such as boron (for example a p-type substrate). Alternatively, the substrate 110 could contain another suitable semiconductor material. For example, the substrate 110 may include silicon that is doped with an n-type dopant such as phosphorous or arsenic (an n-type substrate). The substrate 110 could also contain other elementary semiconductors such as germanium and diamond. The substrate 110 could optionally include a compound semiconductor and/or an alloy semiconductor. Further, the substrate 110 may be strained for performance enhancement and may include a silicon-on-insulator (SOI) structure.

An epi-layer 120 is formed over the substrate 110. The epi-layer 120 may be formed using an epitaxial growth process. In some embodiments, the epi-layer 120 may include a silicon material. In other embodiments, the epi-layer layer 120 may include silicon germanium or another suitable semiconductive material. It is understood that portions of the epi-layer 120 may serve as the active region of the semiconductor device 100. Transistor components such as source/drain regions or channel regions of a metal oxide semiconductor field effect transistor (MOSFET) may be formed at least in part in the epi-layer 120.

An insulating layer 130 is formed over the epi-layer 120. The insulating layer 130 contains an electrically insulating material, such as a dielectric material. In various embodiments, the dielectric material may include silicon oxide, silicon nitride, silicon oxynitride, or a low-k dielectric material. A low-k dielectric material is a dielectric material with a dielectric constant smaller than that of silicon dioxide, which is about 4. As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof.

The insulating layer 130 may be part of an interconnect structure, which may include one or more interconnect layers that provide electrical interconnections (e.g., wiring) between the various doped features, circuitry, and/or input/output of the semiconductor device 100. For example, the interconnect structure may include conductive elements such as vias and/or metal lines. As an example, FIG. 1 illustrates a conductive element 140. The insulating layer 130 provides electrical isolation for the conductive element 140 (and for other conductive elements as well). In some embodiments, the conductive element 140 includes a metal material, such as copper or a copper alloy. The conductive element 140 may be used for bonding and may serve as a bonding pad.

A layer 150 is formed over the insulating layer 130 and over the conductive element 140. In some embodiments, the layer 150 may contain a dielectric material and may serve as an etching-stop layer (ESL). In some embodiments, the layer 150 may include silicon nitride or silicon oxynitride.

A passivation layer 160 is disposed over the layer 150. The passivation layer 160 protects the components of the semiconductor device 100 from elements such as dust, moisture, etc. In some embodiments, the passivation layer 160 contains a dielectric material, such as silicon oxide, silicon nitride, silicon oxynitride, etc.

A layer 170 is formed over the passivation layer 160. Similar to the layer 150, the layer 170 may contain a dielectric material and may serve as an etching-stop layer. However, the layer 170 and the layer 150 may serve as etching stop layers for different processes or layers. For example, the layer 170 may serve as an etching stop layer for the patterning of layers formed thereover (e.g., the layer 180 discussed below). In comparison, the layer 150 may serve as an etching stop layer for deep trench etching processes (discussed below). In some embodiments, the layer 170 may include silicon nitride or silicon oxynitride.

A passivation layer 180 is disposed over the layer 170. Similar to the passivation layer 160, the passivation layer 180 protects the components of the semiconductor device 100 from elements such as dust, moisture, etc. In some embodiments, the passivation layer 180 contains a dielectric material, such as silicon oxide, silicon nitride, silicon oxynitride, etc. As discussed above, the layer 170 may serve as an etching stop layer for the patterning of the passivation layer 180, which is not the focus of this present disclosure. The patterning of the passivation layer 180 also occurs at different regions of the semiconductor device 100 (e.g., not in the portion shown in FIG. 1) and hence not specifically illustrated herein in the ensuing figures. It is also understood that it is possible to implement the semiconductor device 100 without the layer 170 and the passivation layer 180 in certain embodiments.

Figure 2:
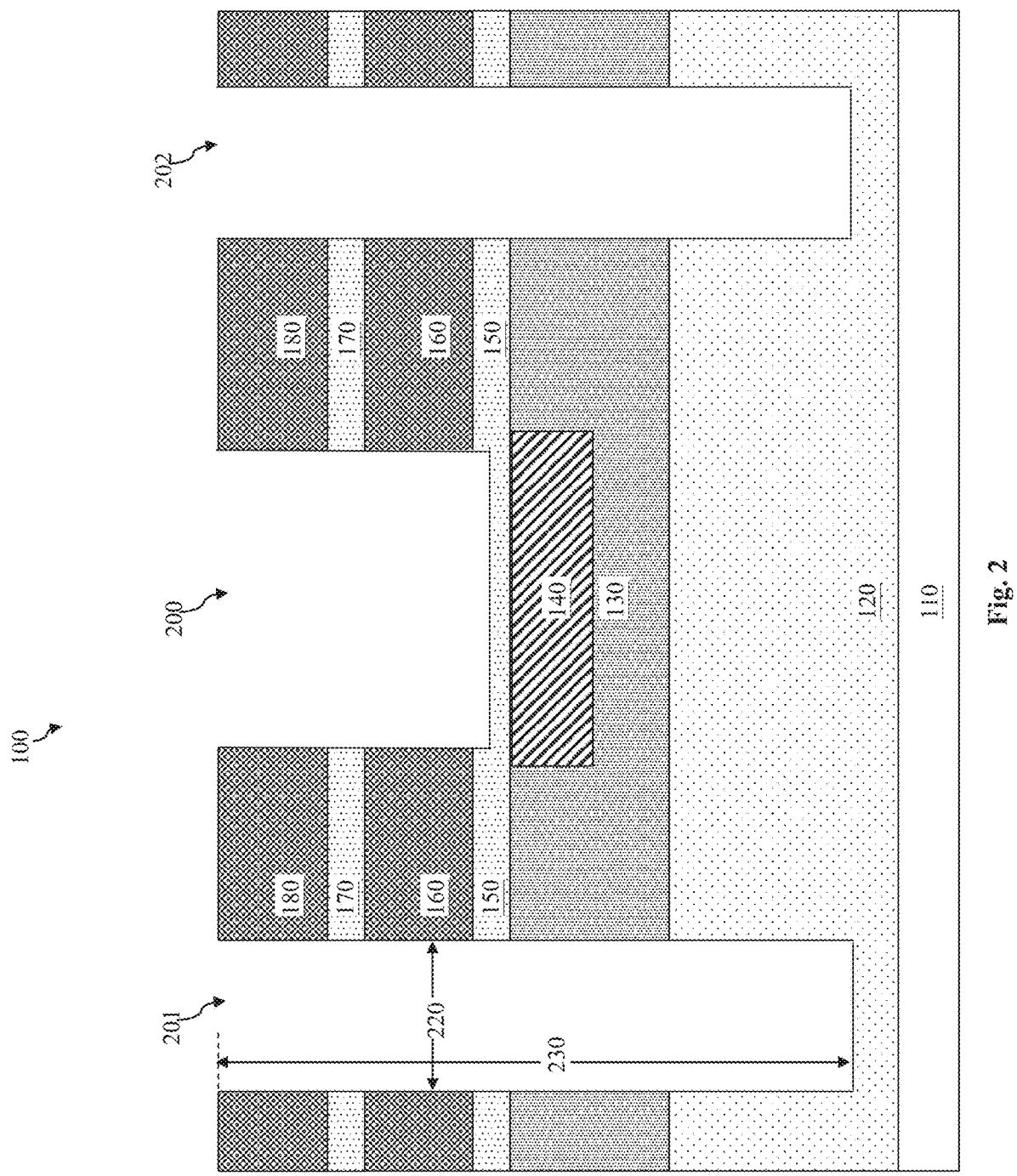

Referring now to FIG. 2, a plurality of trenches is formed in the semiconductor device 100, for example a relatively shallow trench 200 and a plurality of relative deep trenches 201-202. The trenches 200-202 may be formed by one or more etching processes. The trench 200 is vertically aligned with, and formed above, the conductive element 140. As is shown in FIG. 2, the trench 200 extends vertically through the layers 160-180 and at least partially into the layer 150. The trenches 201-202 are formed on opposite sides of the conductive element 140. Each of the trenches 201-202 extends vertically through the layers 130-180 and at least partially into the epi-layer 120. Each of the trenches 201-202 also has a lateral dimension 220 (e.g., width) and a vertical dimension 230 (e.g., a depth). In some embodiments, the vertical dimension 230 is greater than or equal to about 6 microns, for example greater than or equal to about 8 microns.

An aspect ratio of the trench 201 or the trench 202 may be defined as a ratio of the vertical dimension 230 and the lateral dimension 220. In mathematical terms, the aspect ratio of the trench 201 (or trench 202)=(dimension 230)÷(dimension 220). The aspect ratio of the trenches 201 and 202 is relatively high, for example greater than or equal to 10 (or 10:1). This means that the trenches 201 and 202 are long and narrow and therefore may be difficult to fill completely without trapping any air gaps or voids therein. This problem is further compounded by the ever-smaller device sizes as semiconductor scaling down continues. The present disclosure overcomes these problems by using novel and non-obvious processes to fill the trenches 201-202, as discussed below in more detail.

Figure 3:
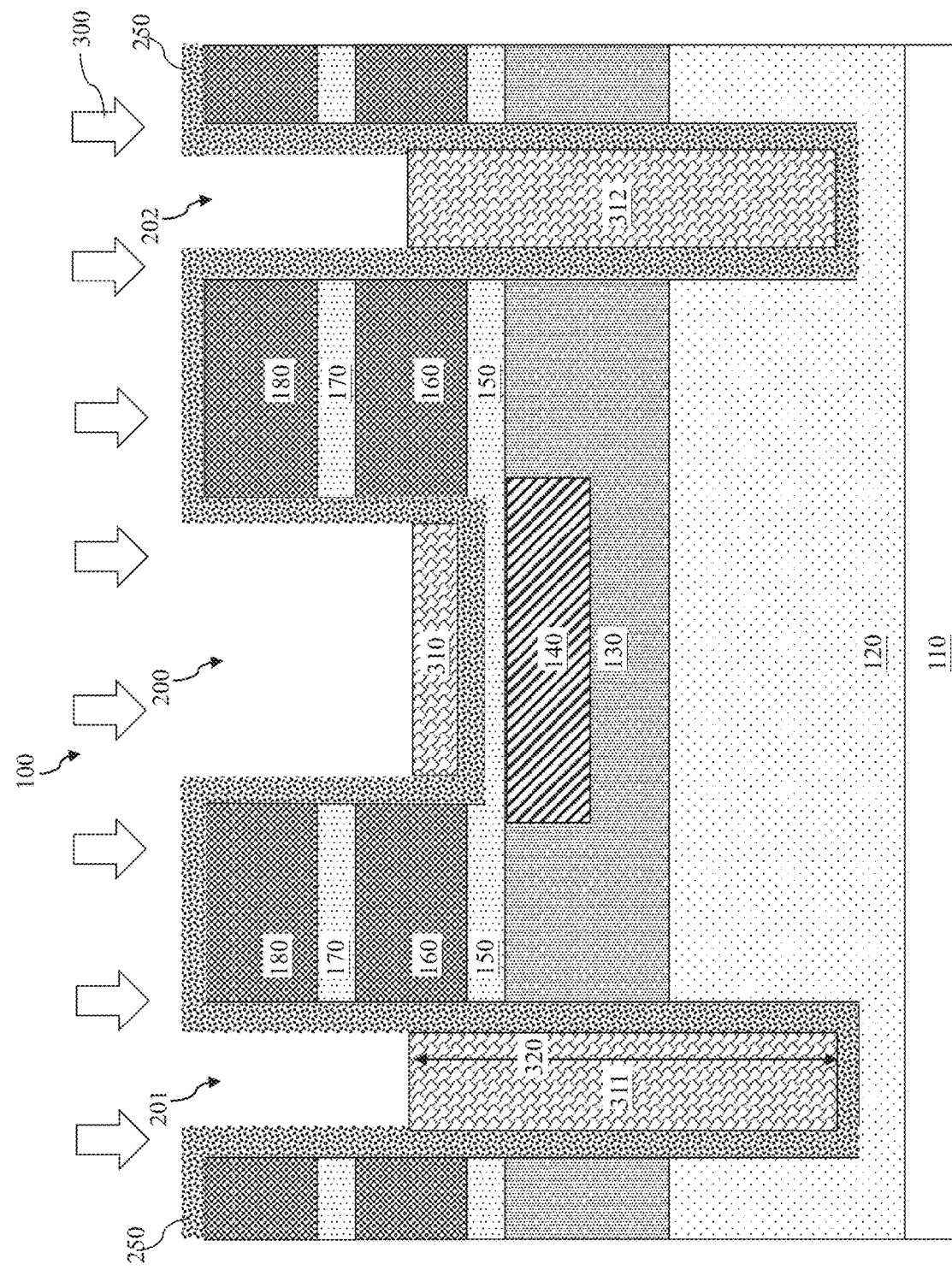

Referring now to FIG. 3, an insulation layer 250 is formed over the semiconductor device 100. In some embodiments, the insulation layer 250 is formed by atomic layer deposition (ALD) and may contain a transition metal oxide/nitride material, such as TaO, TaN, TiO, TiN, ZrO, ZrN, etc. In other embodiments, the insulation layer 250 may be formed by a self-assembly monolayer (SAM) coating technique and may contain long polymer chains with anti-NF$_3$ etching functional groups, such as —OH group. The insulation layer 250 partially fills in the trenches 200-202. After the insulation layer 250 is formed, a spin-on dielectric deposition process 300 is performed to form a dielectric layer 310 in the trench 200, a dielectric layer 311 in the trench 201, and a dielectric layer 312 in the trench 202. In some embodiments, the dielectric layers 310-312 contain an oxide material, such as silicon oxide ($Si_xO_y$). In some embodiments, y is approximately equal to 2×, for example between about 1.8× and about 2.2×. The silicon content in the layers 310-312 may be associated with a refractive index (RI) of the layers 310-312. In some embodiments, the refractive index of the layers 310-312 is in a range between about 1.4 and about 1.7.

The dielectric layers 310-312 are in a liquid state during the deposition as well as immediately after the deposition. Due to the liquid nature of the dielectric layers 310-312, they can fill small crevices such as the trenches 201-202 substantially without air gaps or voids, even though the trenches 201-202 have high aspect ratios (e.g., greater than or equal to 10:1). In addition, since the dielectric layers 310-312 are in a liquid state, they can be spun as a part of the spin-on dielectric deposition process 300 to improve uniformity. In some embodiments, upper surfaces of the dielectric layers 310-312 are substantially coplanar.

As shown in FIG. 3, the dielectric layer 311 or 312 each have a thickness 320 (measured in a vertical dimension). The value of the thickness 320 may be tuned by configuring one or more process parameters of the spin-on dielectric deposition process 300, such as deposition time. The thickness 320 is smaller than or substantially equal to the depth 230 of the trench 201/202. The thickness 320 of the dielectric layer 311/312 is within about 40% to about 100% of the depth 230 of the trench 201/202. In other words, the dielectric layers 310-312 may just partially fill the trenches 200-202 in some embodiments, or that they may completely fill the trenches 200-202 in some other embodiments. Due to the presence of the dielectric layers 311-312 in the trenches 201-202, the now-at-least-partially-filled trenches have a smaller aspect ratio after the performance of the deposition process 300. In some embodiments, the trenches 201-202 may have an aspect ratio less than about 6:1, for example an aspect ratio ranging between about 6:1 to about 0:1.

The dielectric layers 310-312 also deliver a tensile stress (e.g., the stress state leading to expansion) to the semiconductor device 100. In some embodiments, the tensile stress delivered by the dielectric layers 310-312 is greater than or substantially equal to about 4.0×10$^8$ dyne/centimeter$^2$. In some embodiments, the tensile stress delivered by the dielectric layers 310-312 is greater than or substantially equal to about 200 megapascals (MPa). Although such a tensile stress would have contributed to a warpage of a wafer if unaccounted for, the present disclosure overcomes this problem by forming other material layers that apply compressive stress, so as to compensate for the tensile stress, as discussed below in more detail.

Figure 4:
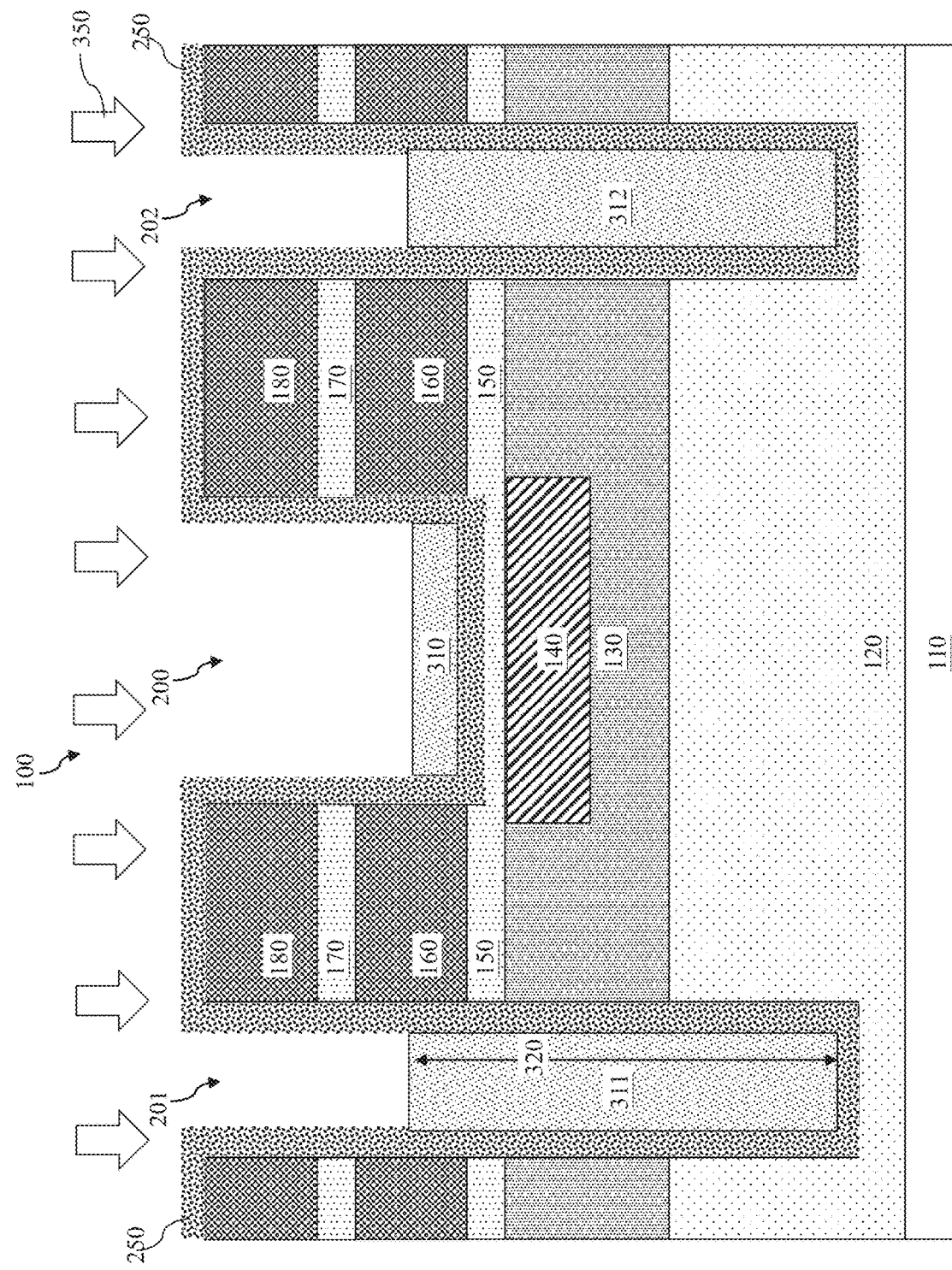

Referring now to FIG. 4, an annealing process 350 is performed to the semiconductor device 100. In some embodiments, the annealing process 350 is performed with a process temperature in a range between about 80 degrees Celsius and about 800 degrees Celsius. The annealing process 350 bakes the dielectric layers 310-312. As discussed above, the dielectric layer 310-312 are in a liquid state during and immediately after the performance of the spin-on dielectric deposition process 300, since the liquid state facilitates the filling of the trenches 200-202, particularly the trenches 201-202 with high aspect ratios. Furthermore, the annealing process 350 facilitates the transformation of the dielectric layers 310-312 from the liquid state to a solid state.

Figure 5:
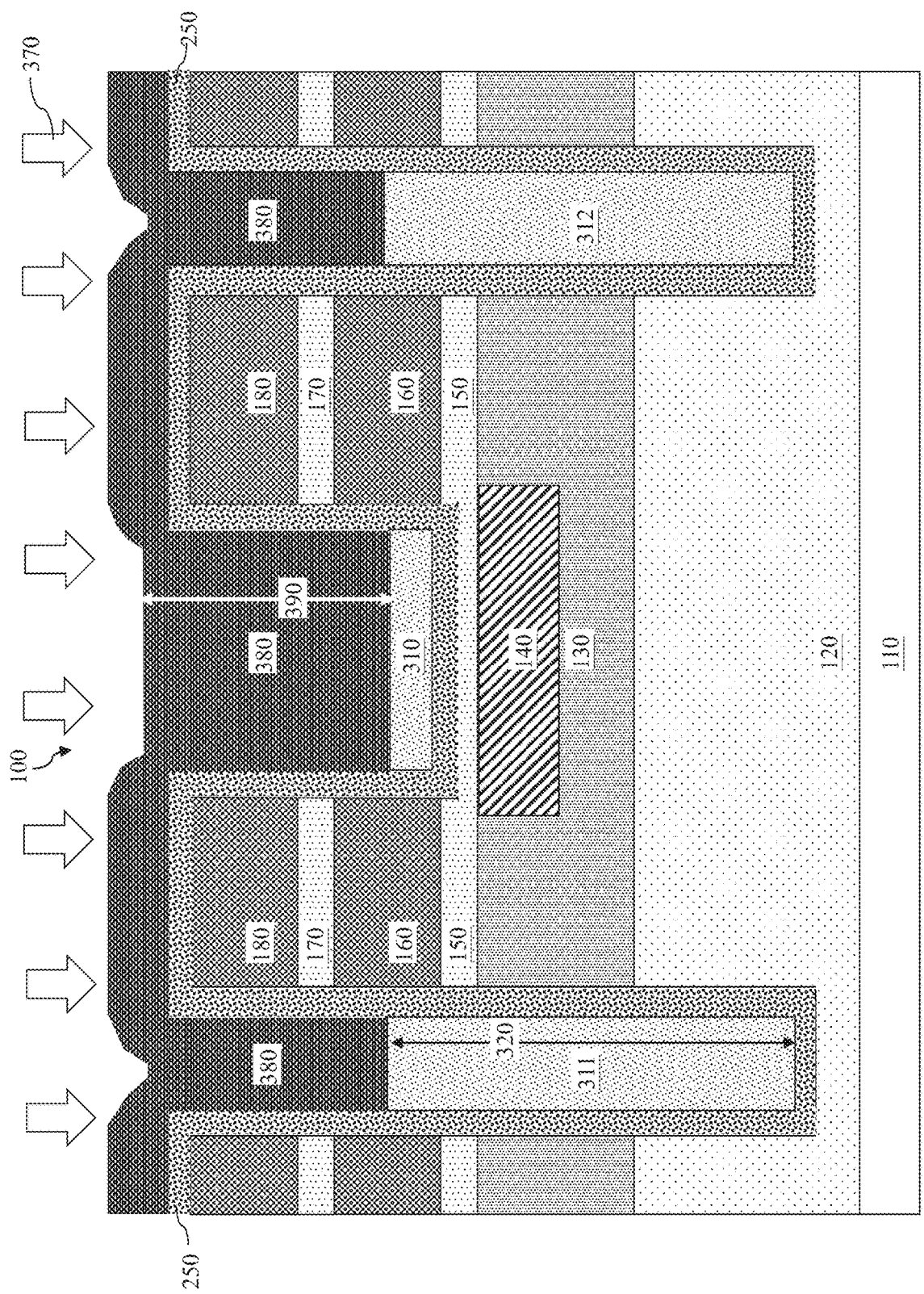

Referring now to FIG. 5, a deposition process 370 is performed to deposit a layer 380. In some embodiments, the deposition process 370 includes a high-aspect-ration (HARP) process that is configured to deposit materials in small trenches with high aspect ratios. In some embodiments, the HARP process may include a thermal process that deposits a silicon oxide film, with tetraethyl orthosilicate (TEOS) and O$_3$ as precursors.

The layer 380 is deposited over the dielectric layers 310-312 and over the insulation layer 250 and has a thickness 390. If the trenches 200-202 had not been completely filled by the dielectric layers 310-312 (such as the illustrated embodiment herein), the layer 380 will completely fill the rest of the trenches 200-202. In other words, portions of the layer 380 may be formed above the dielectric layers 310-312 and in the trenches 200-202, and other portions of the layer 380 are formed above and outside of the trenches 200-202. In various embodiments, the layer 380 may fill about 0% to about 60% of the trenches 201-202 (in terms of the trench depth).

Although the gap filling performance of the deposition process 370 may not be quite as good as the spin-on dielectric deposition process 300, it will still not pose a problem in terms of filling the trenches 200-202. This is because the partially filled trenches 200-202 (e.g., partially filled by the dielectric layers 310-312) already have reduced aspect ratios, since their depth is reduced, while their width remains substantially the same. Therefore, the deposition process 370 may still be able to fill the remainder of the trenches 200-202 without creating voids or gaps therein.

In some embodiments, the layer 380 includes an oxide material, such as silicon oxide ($Si_xO_y$). In some embodiments, y is approximately equal to 2×, for example between about 1.8x and about 2.2×. The silicon content in the layer 380 may be associated with a refractive index (RI) of the layers 380. In some embodiments, the refractive index of the layers 380 is in a range between about 1.4 and about 1.7.

The layer 380 may deliver a stress that may be tensile or compressive. In some embodiments, the tensile or compressive stress delivered by the dielectric layer 380 is in a range between about −100 MPa and about 200 MPa. In embodiments where the stress delivered by the layer 380 is tensile, the tensile stress is much smaller than the tensile stress delivered by the dielectric layers 310-312, and such a tensile stress will be compensated for by the compressive stress delivered by subsequently-formed layers, as discussed below. It is understood that the dielectric layers 310-312 and/or the layer 380 may not be the only components that cause tensile stress. Other components of the semiconductor device 100 may cause tensile stress as well, and the combined tensile stress need to be compensated, otherwise it may cause problems such as wafer warpage and bonding cracks, as discussed below in more detail.

One advantage of the present disclosure is the good gap filling performance in terms of filling the trenches 200-202, particularly the trenches 201-202, since they have a high aspect ratio (e.g., greater than about 10:1). Conventional fabrication processes typically use atomic layer deposition (ALD) to fill trenches with a high aspect ratio, such as the trenches 201-202. Unfortunately, as device sizes shrink and/or the aspect ratio increases, even ALD processes may trap air gaps or voids in the material formed to fill in the trenches. These air gaps or voids could lead to fabrication problems down the road and may degrade device performance. In comparison, the two-step process (e.g., processes 300 and 370) allows the trenches 201-202 to be filled without having air gaps or voids trapped therein. This obviates the problems that could have been caused by air gaps or voids in later processes.

In embodiments where two different processes (e.g., process 300 and 370) are performed to fill the lower parts and upper parts of the high aspect ratio trenches 201-202 with the dielectric layers 311-312 and the layer 380 respectively, advantages may be derived. In more detail, while the spin on dielectric deposition process 300 may have excellent gap filling performance, the resulting dielectric layers 311-312 may have a relatively high tensile stress, which could cause wafer warpage. When the entire trenches 201-202 are completely filled by the dielectric layers 311-312, the resulting tensile stress may be relatively high, which may place a high burden on the subsequent processes to compensate for the tensile stress. When the trenches 201-202 are partially filled (as is the case in the illustrated embodiment), however, the resulting tensile stress is not quite as high, which may be more easily compensated by the subsequent fabrication processes. And as discussed above, it is not a problem to just partially fill the trenches 201-202 by the deposition process 300, since the subsequent trench filling only needs to fill trenches with substantially reduced aspect ratios (e.g., 6:1 or less). This may be easily achieved by the deposition process 370 without trapping voids therein, even though its gap filling performance is not quite as good as the deposition process 300. Therefore, there is hardly any loss of performance (if at all) in terms of trench filling without trapping gaps or voids therein. Advantageously, since the layer 380 formed by the deposition process 370 has low tensile stress or no tensile stress at all, the overall tensile stress is reduced, which means compensating for the tensile stress of the dielectric layers 311-312 may be easier.

In some embodiments, a warpage of a wafer on which the semiconductor device 100 is fabricated is measured after the formation of the layer 380. Since the wafer warpage is attributed to the tensile stress caused by the various components of the semiconductor device (e.g., tensile stress delivered by the dielectric layers 310-312 and possibly by the layer 380), the wafer warpage measurement provides an indication of how much compressive stress may be needed to compensate for the tensile stress. However, it is understood that this wafer warpage measurement step is optional and may be skipped in some embodiments.

Figure 6:
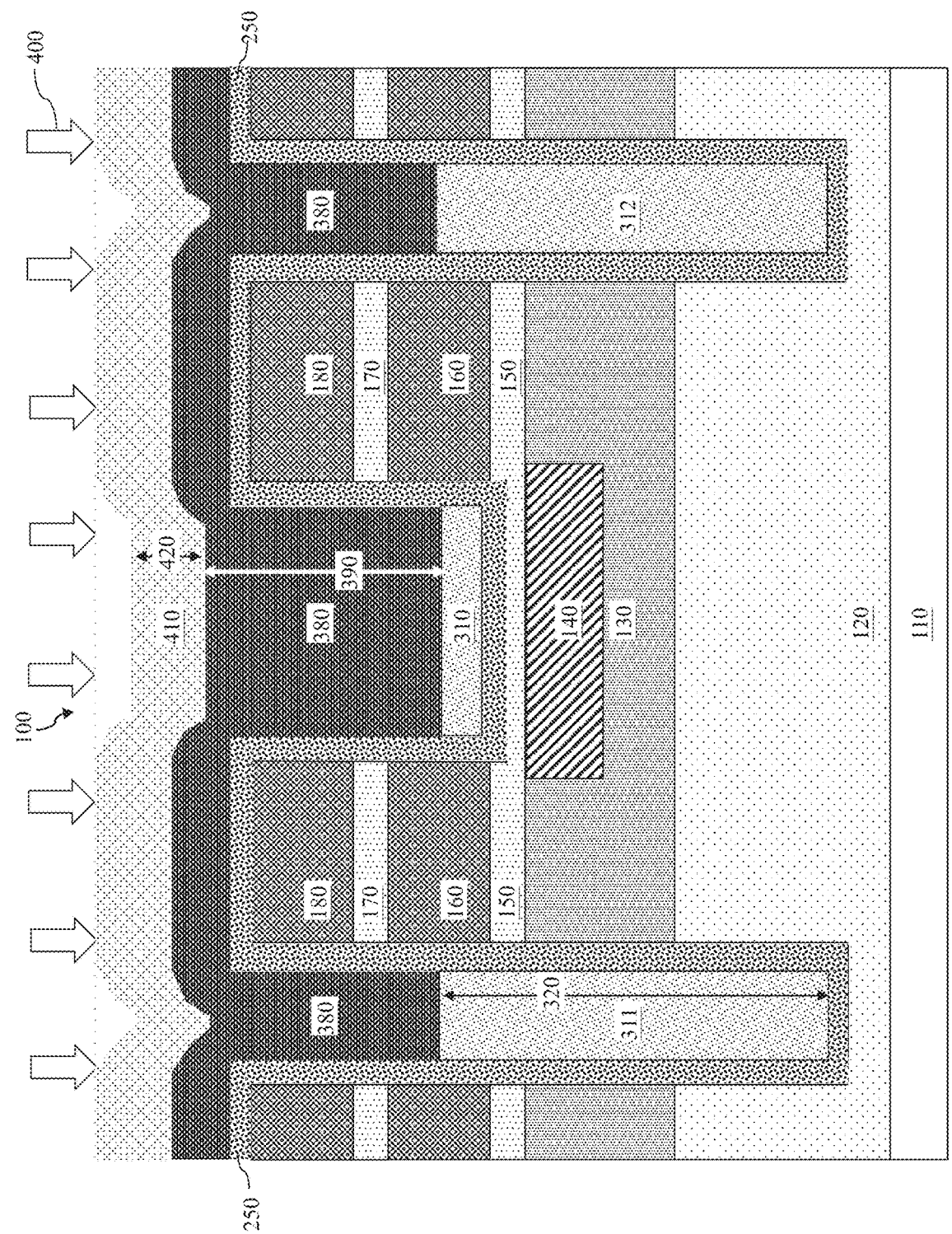

Referring now to FIG. 6, a high density plasma (HDP) deposition process 400 is performed to deposit a dielectric layer 410 over the layer 380. In some embodiments, the dielectric layer 410 contains an oxide material, for example silicon oxide ($Si_xO_y$). In some embodiments, y is approximately equal to 2x, for example between about 1.8x and about 2.2x. The silicon content in the layer 410 may be associated with a refractive index (RI) of the layers 410. In some embodiments, the refractive index of the layers 410 is in a range between about 1.4 and about 1.7. In some embodiments, the HDP deposition process 400 may be performed using precursors that include silane ($SiH_4$) and oxygen ($O_2$).

The dielectric layer 410 also delivers a compressive stress. In some embodiments, the compressive stress delivered by the dielectric layer 410 is less than or substantially equal to about $-1.0 \times 10^9$ dyne/centimeter$^2$. In some embodiments, the tensile stress delivered by the dielectric layer 410 is less than or substantially equal to about $-100$ MPa. The compressive stress counteracts against the tensile stress delivered by the dielectric layers 310-312 (and possibly by the layer 380). As such, the dielectric layer 410 can reduce a potential warpage of the wafer caused by tensile stress. The dielectric layer 410 has a thickness 420. The thickness 420 is tuned to be within a certain percentage of a total combined thickness of the layers 380 and 311/312, which may be a sum of the thickness 320 and the thickness 390. In some embodiments, the thickness 420 is tuned to be within about 20% to about 80% of a sum of the thicknesses 320 and 390. This range is optimized because it allows the dielectric layer 410 to deliver a sufficient amount of compressive stress to counteract against the tensile stress delivered by the various components of the semiconductor device (e.g., by the layers 310-312 and/or 380), but not too much such that the wafer will experience warpage due to excessive compressive stress either. In some embodiments, the compressive stress may have a memory, for example due to a stress memorization technique (SMT). In other words, even after the dielectric layer 410 is removed, the compressive stress delivered by the dielectric layer 410 may at least partially remain.

Figure 7:
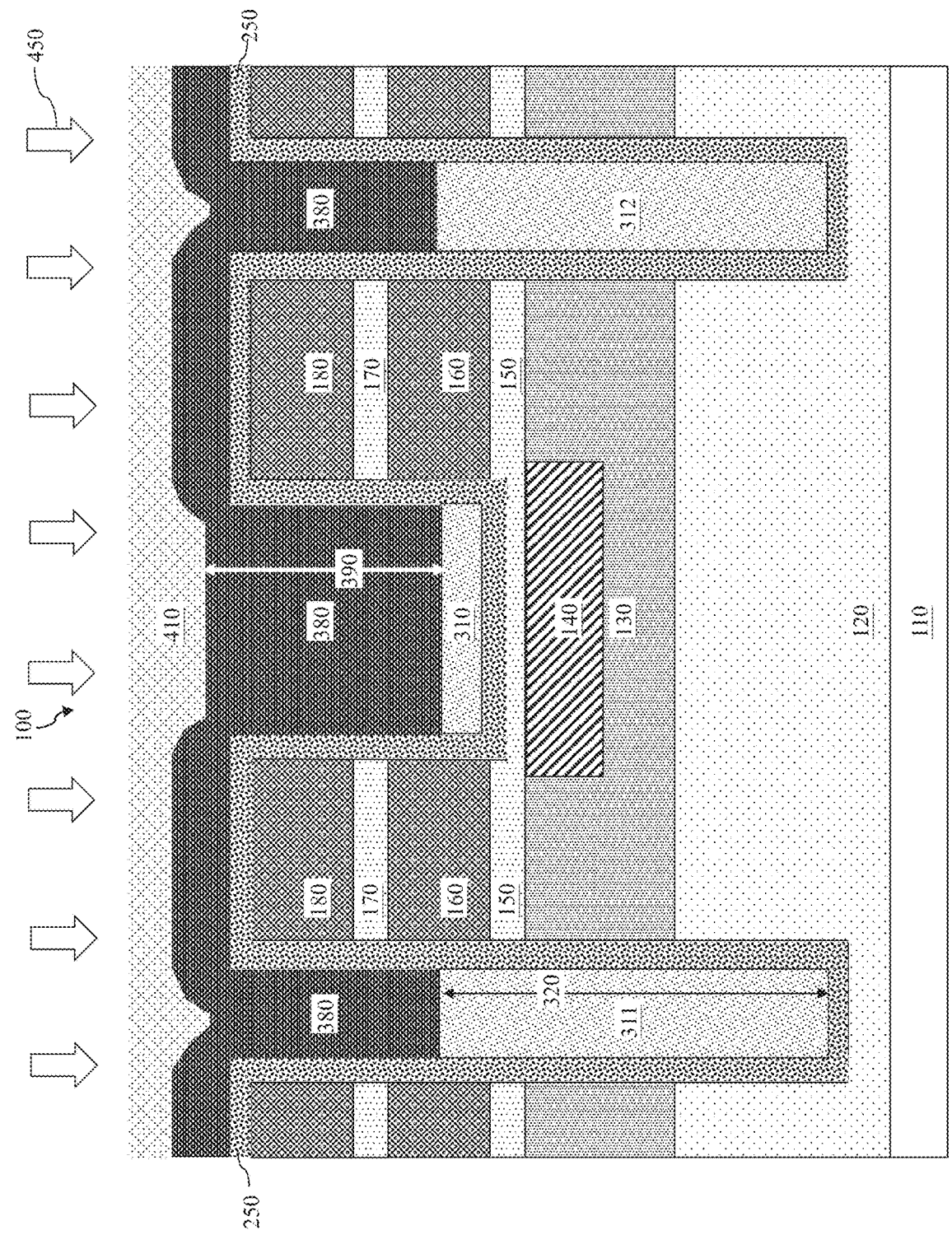

Referring now to FIG. 7, a planarization process 450 is optionally performed to the dielectric layer 410. For example, the planarization process 450 may include a chemical mechanical polishing (CMP) process, which flattens the upper surface of the dielectric layer 410. Had the trenches 200-202 not been filled according to the processes of the present disclosure discussed above, voids or air gaps could have been formed in the materials filling the trenches. Sometimes, the voids may have a shape that resembles a line or seam that runs vertically. When a CMP process such as the process 450 is performed, the chemicals used (e.g., slurry) may get into the voids. Such a chemical residue in the voids may be difficult to remove in later processes, which could contaminate the semiconductor device 100 and degrade performance. However, since the present disclosure fills in the high aspect ratio trenches without trapping voids therein, the planarization process 450 will not generate such an undesirable chemical residue.

Figure 8:
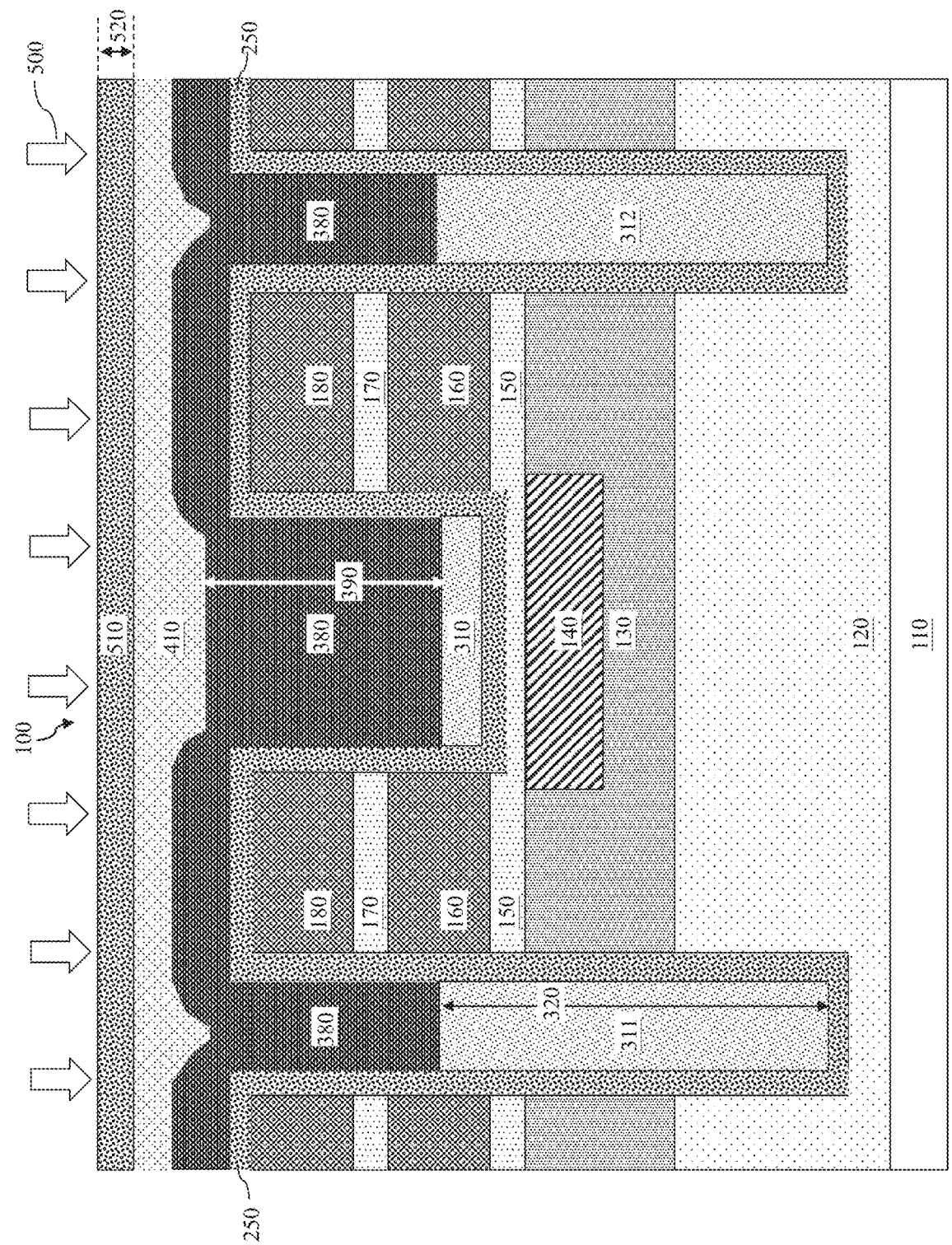

Referring now to FIG. 8, a deposition process 500 is performed to form a layer 510 over the dielectric layer 410. In some embodiments, the deposition process 500 includes plasma-enhanced chemical vapor deposition (PECVD). The layer 510 is formed to contain silicon oxide ($Si_xO_y$) in some embodiments, or silicon nitride ($Si_xN_y$) in some other embodiments. In embodiments where the layer 510 contains silicon oxide, the deposition process 500 may use $SiH_4$/TEOS and $O_2$ as precursors. In embodiments where the layer 510 contains silicon nitride, the deposition process 500 may use $SiH_4$ and $N_2O/NH_3$ as precursors.

In embodiments where the layer 510 contains silicon oxide, y is approximately equal to 2x, for example between about 1.8x and about 2.2x. In embodiments where the layer 510 contains silicon nitride, y is approximately equal to (4/3)x, for example, y between about 1.1x and about 1.5x. The silicon content in the layer 510 may be associated with a refractive index (RI) of the layer 510. In some embodiments, the refractive index of the layer 510 is in a range between about 1.4 and about 1.7 when the layer 510 contains silicon oxide, and the refractive index of the layer 510 is in a range between about 1.7 and about 2.2 when the layer 510 contains silicon nitride.

The layer 510 also delivers a compressive stress. In some embodiments, the compressive stress delivered by the layer 510 is in a range between about $-5.0 \times 10^9$ dyne/centimeter$^2$ and about $-2.0 \times 10^8$ dyne/centimeter$^2$. In some embodiments, the compressive stress delivered by the layer 510 is in a range between about $-300$ MPa and about $-50$ MPa.

The compressive stress also helps to counteract against the tensile stress caused by the various components of the semiconductor device (e.g., by the layers 310-312 and/or 380), which helps to reduce wafer warpage. The amount of the compressive stress delivered by the layer 510 may be configured by adjusting its material composition (e.g., by varying the x and y values discussed above) or by adjusting its thickness 520. In some embodiments, the thickness range of the layer 510 is configured such that the combined compressive stress delivered by the layers 410 and 510 will substantially cancel out the tensile stress delivered by the layers 310-312 and/or layer 380. In some embodiments, the thickness 520 is in a range between about 50 nanometers (nm) and about 200 nm. In some embodiments, the compressive stress may have a memory. In other words, even after the dielectric layer 510 is removed, the compressive stress delivered by the dielectric layer 510 may at least partially remain. In addition to delivering compressive stress, another function served by the layer 510 is that it facilitates adhesion with a carrier wafer in a bonding process discussed below.

Figure 9:
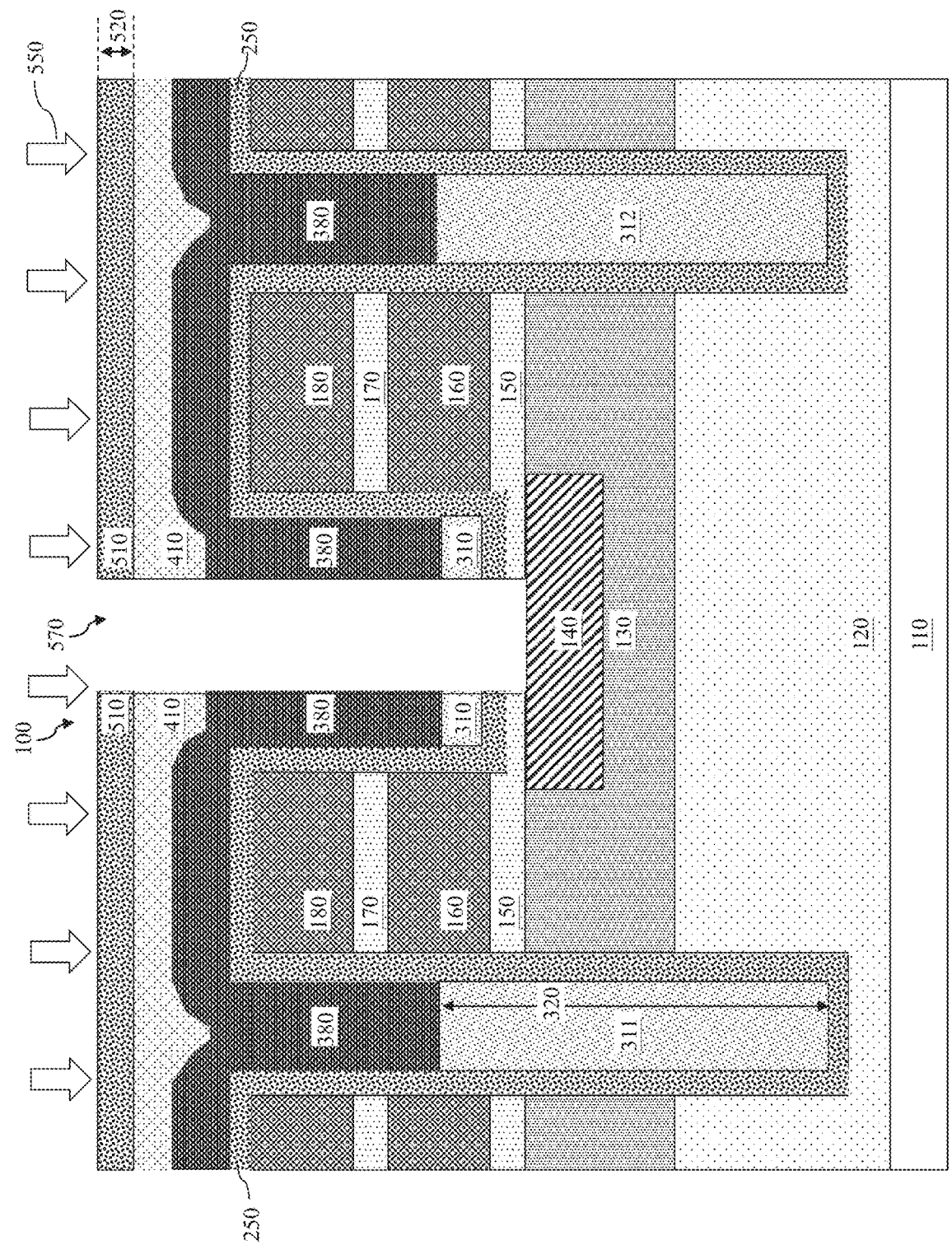

Referring now to FIG. 9, an etching process 550 is performed to the semiconductor device 100 to form an opening or a recess 570. The opening 570 extends vertically through the layers 510, 410, 380, 310, 250, and 150 and exposes a portion of the conductive element 140.

Figure 10:
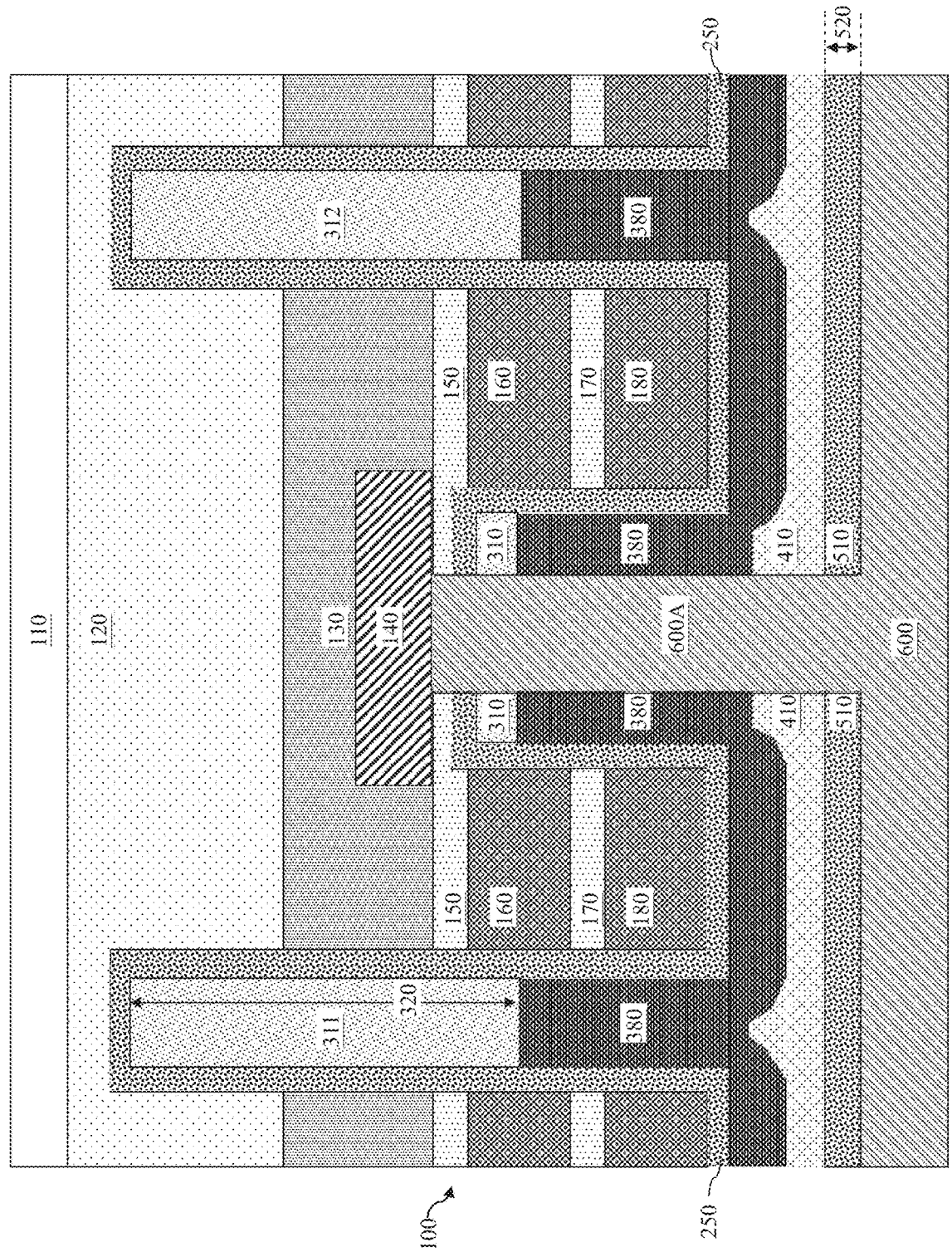

Referring now to FIG. 10, the semiconductor device 100 is flipped vertically upside down. A carrier substrate 600 is then bonded to the semiconductor device 100. The carrier substrate 600 includes a protruding component 600A (e.g., containing a metal material) that is inserted into the opening 570. It is through the protruding component 600A that the carrier substrate 600 is bonded to the semiconductor device 100 (e.g., bonded to the conductive element 140).

As discussed above, the wafer warpage has been substantially reduced or eliminated herein, for example by the implementation of the layers 410 and 510 (which deliver compressive stress) to compensate for the tensile stress delivered by the layers 310-312 and/or 380. Had the wafer warpage not been reduced, such a warpage may cause the portion of the semiconductor device 100 corresponding to the conductive element 140 to bend upwards, while the rest of the semiconductor device 100 may be bending downwards. As such, the bonding of the carrier substrate 600 with the semiconductor device 100 may cause a bonding crack, for example at or near an interface between the protruding component 600A and the conductive element 140. The small area (e.g., due to device scaling down) associated with the bonding interface may exacerbate the problem. The bonding crack would have degraded device performance or even lead to failures. The present disclosure eliminates or at least reduces the likelihood of the bonding crack by applying compressive stress to counteract against the tensile stress. This helps to make the wafer substantially flatter, which avoids the bonding crack issues that often plague conventional semiconductor devices.

Figure 11:
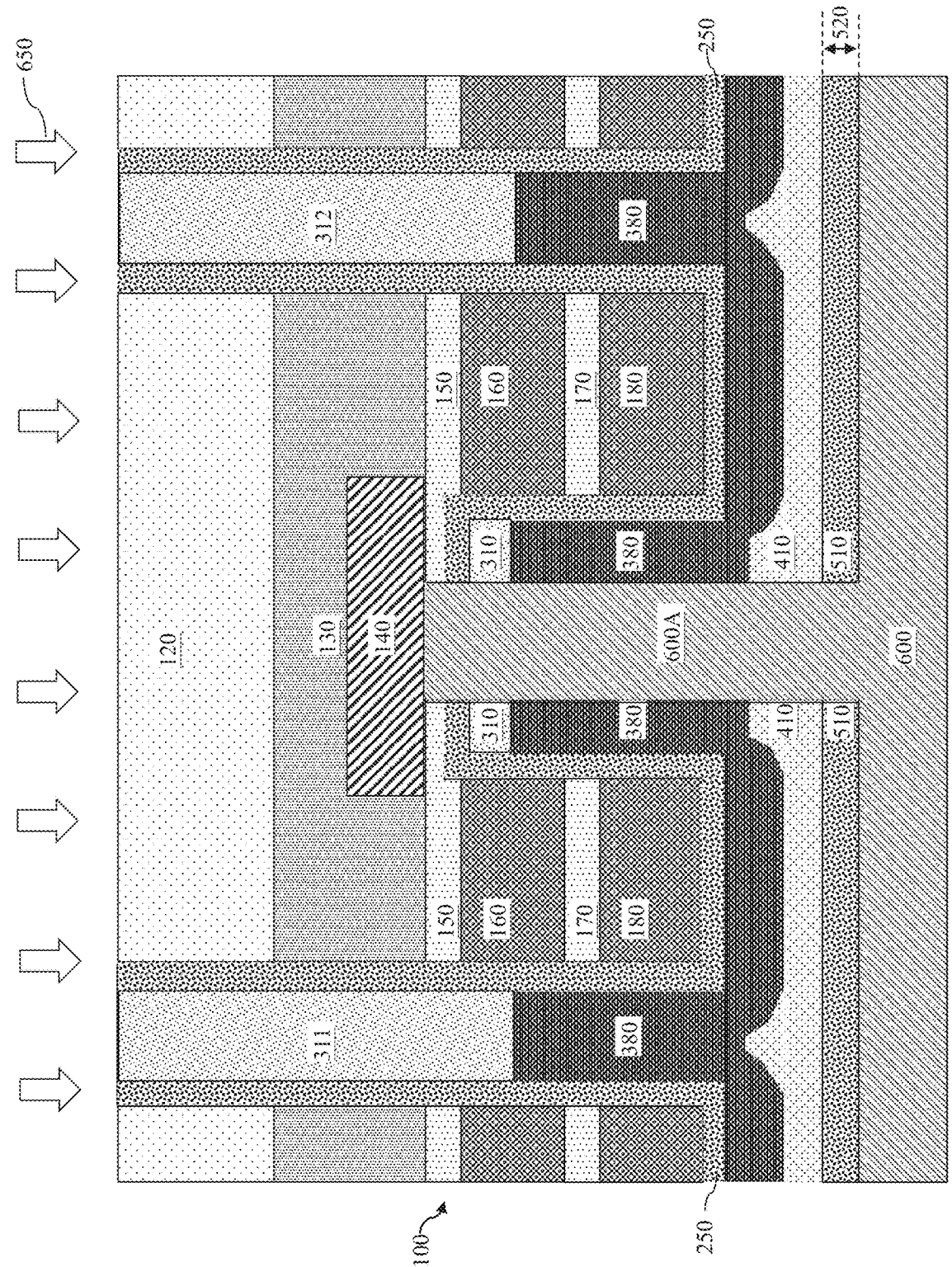

Referring now to FIG. 11, a grinding process 650 is performed to the semiconductor device 100 from the "back side" (e.g., the side facing away from the carrier substrate 600) of the semiconductor device 100. The grinding process 650 removes the substrate 110 and may remove portions of the layer 250 and/or portions of the epi-layer 120. In some embodiments, the grinding process 650 may include a mechanical grinding process and/or a chemical thinning process. For example, the mechanical grinding process may remove a substantial amount of the materials such as the substrate 110, and then the chemical thinning process may apply an etching chemical to further thin the semiconductor device 100.

Figure 12:
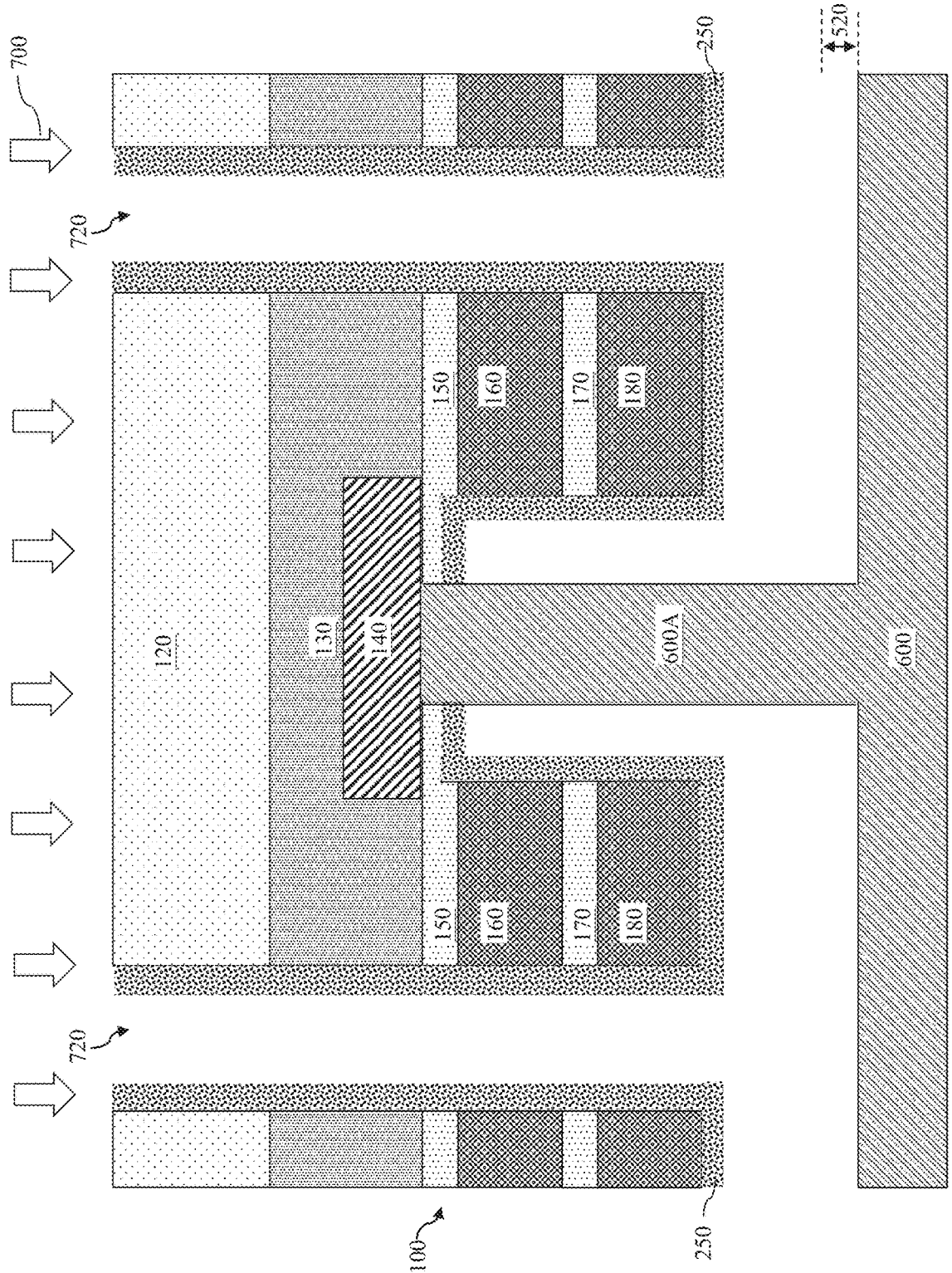

Referring now to FIG. 12, an etching process 700 is performed to the semiconductor device 100. In some embodiments, the etching process 700 uses $NF_3$ as an etchant. The etching process 700 removes the layers 310-312, 380, 410, and 510. The removal of the layers 310-312, 380, 410, and 510 forms openings 720. As such, the etching process 700 may divide up the semiconductor device 100 into multiple pieces, for example each piece being separated from other pieces by the openings 720. In some embodiments, each of the pieces may be packaged into an IC chip.

Note that had the slurry residue from the planarization process 450 remained in the trenches 200-202 (e.g., due to the existence of voids or gaps), the etching process 700 may not be able to completely etch away the slurry residue. This is because the difference in material compositions between the slurry residue (which may contain one or more organic compounds) and the layers 310-312, 380, 410, and 510, which contain dielectric materials such as silicon oxide or silicon nitride. In other words, the etching process 700 may have an etching selectivity that allows it to etch away the dielectric materials of the layers 310-312, 380, 410, and 510 at much faster etching rates than the organic compounds of the slurry. However, since the present disclosure fills the trenches without voids or gaps, there would have been no slurry residue trapped in the layers 310-312, 380, 410, and 510. Consequently, the removal of the layers 310-312, 380, 410, and 510 may be complete, and no contamination will be left behind.

Figure 13:
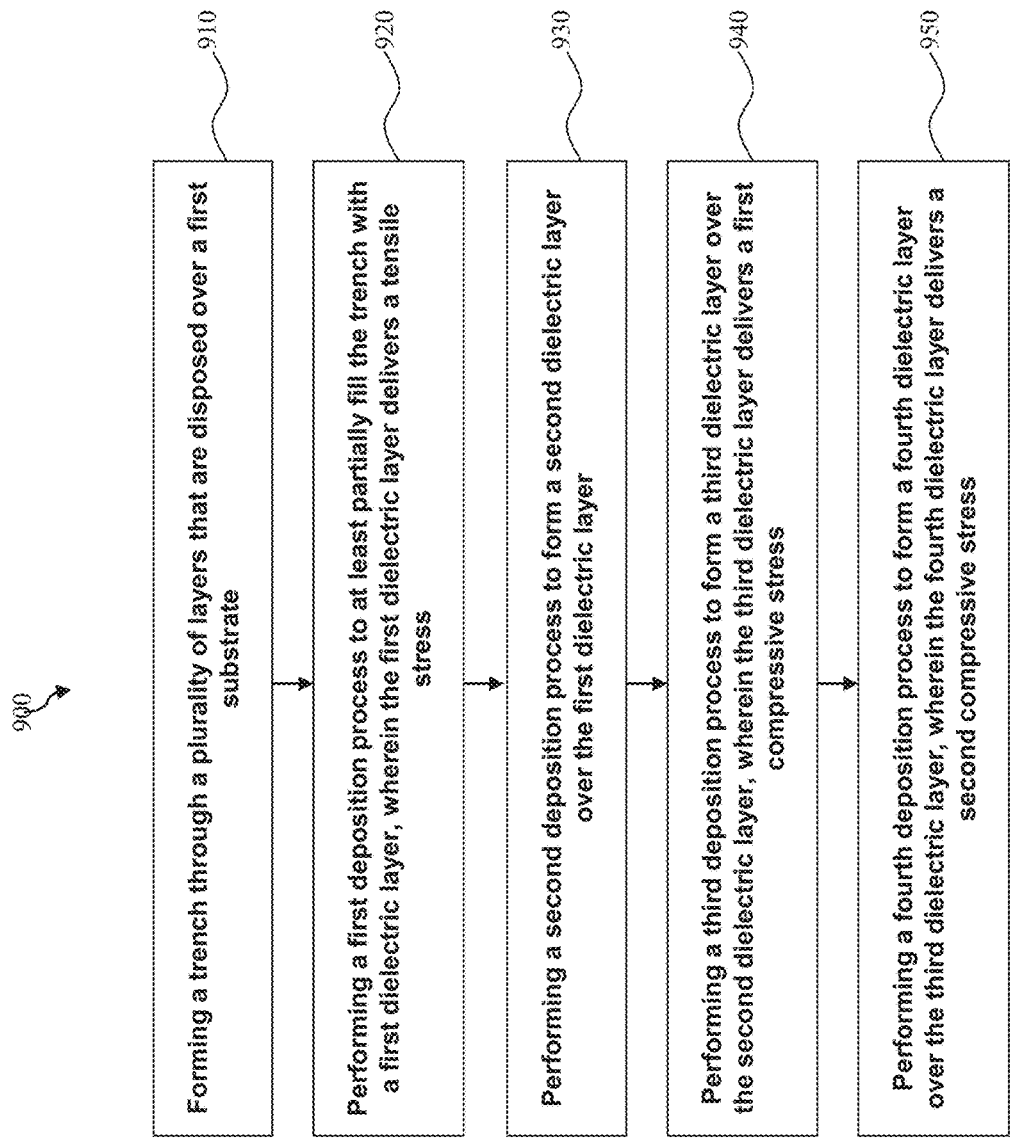
FIG. 13 is a flowchart illustrating a method of fabricating a semiconductor device according to an embodiment of the present disclosure.

FIG. 13 illustrates a flowchart of a method 900 for performing a method of fabricating a semiconductor device according to various aspects of the present disclosure. The method includes a step 910 of forming a trench through a plurality of layers that are disposed over a first substrate. In some embodiments, the trench is formed with an aspect ratio greater than or equal to about 10:1.

The method includes a step 920 of performing a first deposition process to at least partially fill the trench with a first dielectric layer. The first dielectric layer delivers a tensile stress. In some embodiments, the first deposition process comprises a spin on dielectric deposition process to at least partially fill the trench with the first dielectric layer. The first dielectric layer is in a liquid state during the spin on dielectric deposition process. An annealing process may be performed after the first deposition process but before the second deposition process. The annealing process bakes the first dielectric layer to transform the first dielectric layer from the liquid state to a solid state.

The method includes a step 930 of performing a second deposition process to form a second dielectric layer over the first dielectric layer. In some embodiments, the second deposition process includes a high aspect ratio deposition process (HARP). In some embodiments, the first deposition process partially fills the trench with the first dielectric layer, and the second deposition process completely fills a rest of the trench with the second dielectric layer.

The method includes a step 940 of performing a third deposition process to form a third dielectric layer over the second dielectric layer. The third dielectric layer delivers a first compressive stress. In some embodiments, the third deposition process includes a plasma process, such as a high density plasma (HDP) deposition process. In some embodiments, the third deposition process is performed such that a thickness of the third dielectric layer is in a range between about 20% and about 80% of a combined thickness of the first dielectric layer and the second dielectric layer.

The method includes a step 950 of performing a fourth deposition process to form a fourth dielectric layer over the third dielectric layer. The fourth dielectric layer delivers a second compressive stress. In some embodiments, the fourth deposition process includes a plasma enhanced chemical vapor deposition (PECVD) process.

In some embodiments, the first dielectric layer, the second dielectric layer, and the third dielectric are formed to each contain a silicon oxide material, and the fourth dielectric layer is formed to contain a silicon nitride material.

It is understood that additional processes may be performed before, during, or after the steps 910-950. For example, the method 900 may further include steps of: forming a recess that extends through the first dielectric layer, the second dielectric layer, the third dielectric layer, and the fourth dielectric layer, wherein the recess exposes a conductive element formed in one of the plurality of layers; performing a bonding process with a second substrate, wherein the second substrate includes a protruding component that is inserted into the recess and bonded with the conductive element; and performing one or more etching processes to remove the first dielectric layer, the second dielectric layer, the third dielectric layer, and the fourth dielectric layer. Other processes are not discussed herein in detail for reasons of simplicity.

In summary, the present disclosure implements one or more processes with good gap filling performance (such as a spin-on dielectric deposition process and a HARP process) to form materials in high aspect ratio trenches without leaving voids or gaps trapped therein. The present disclosure also forms layers that deliver compressive stress, in order to counteract against the tensile stress experienced by the wafer.

Based on the above discussions, it can be seen that the present disclosure offers advantages over conventional image sensor devices. It is understood, however, that other embodiments may offer additional advantages, and not all advantages are necessarily disclosed herein, and that no particular advantage is required for all embodiments. One advantage pertains to the improvement in gap filling performance. Since the semiconductor device herein includes high aspect ratio trenches (e.g., an aspect ratio greater than or equal to about 10:1), it would have been very difficult for conventional semiconductor fabrication processes to fill these trenches without leaving gaps or voids trapped therein. Quite often, a "line" void may be trapped in the materials filling the high aspect ratio trenches according to conventional semiconductor fabrication processes. Such voids or gaps may lead to problems in fabrication later. For example, a polishing process such as a CMP process may be performed in a later fabrication step. The polishing process may use a chemical slurry, which may get in to the voids or gaps. The slurry residue may be difficult to remove by later processes, which may leave contamination behind for the semiconductor device.

The present disclosure obviates this problem by utilizing a spin-on deposition process to form a dielectric material in a liquid state in the high aspect ratio trenches. Such a process has good gap filling performance. In embodiments where the dielectric material does not completely fill the trenches, the depth of the trench is still reduced, which means that the aspect ratio is reduced. The reduced aspect ratio of the trench (which is already partially filled by the dielectric material) makes it much easier to fill using the subsequent HARP process. Thus, through the spin-on deposition process alone, or through a combination of the spin-on deposition process and the HARP process, the high aspect ratio trenches of the present disclosure may be completely filled without voids or gaps trapped therein. This eliminates the possibility of contaminant materials such as CMP slurry residue being trapped in the voids or gaps, and consequently device performance may be improved.

Another advantage of the present disclosure pertains to the elimination of bonding crack by reducing wafer warpage. In more detail, some of the layers formed in the semiconductor device (such as layers filling the high aspect ratio trenches) may apply a tensile stress. The tensile stress may cause the wafer to bend or warp. If left uncorrected (as is the case in conventional fabrication), the warpage of the wafer may cause bonding cracks at or near an interface between the semiconductor device and a carrier substrate. The bonding cracks may degrade device performance or even cause device failures. To overcome this problem, the present disclosure forms one or more layers that apply a compressive stress, which may remain (due to a stress memorization technique) even after the layers are removed. The compressive stress compensates for the tensile stress, and consequently the wafer warpage or bending is substantially reduced or eliminated altogether. As a result, bonding cracks are substantially eliminated as well, and device performance is improved.

Other advantages include computability with existing fabrication process flow and ease and low cost of implementation.

One aspect of the present disclosure pertains to a method of fabricating a semiconductor device. The method includes: forming a trench through a plurality of layers that are disposed over a first substrate; performing a first deposition process to at least partially fill the trench with a first dielectric layer, wherein the first dielectric layer delivers a tensile stress; performing a second deposition process to form a second dielectric layer over the first dielectric layer; and performing a third deposition process to form a third dielectric layer over the second dielectric layer, wherein the third dielectric layer delivers a first compressive stress.

Another aspect of the present disclosure pertains to a method of fabricating a semiconductor device. The method includes: forming a trench through a stack of layers that are disposed over a device substrate, wherein the trench has an aspect ratio greater than or equal to about 10:1, and wherein one of the layers of the stack contains a bonding pad; partially filling, using a spin on dielectric deposition process, the trench with a first dielectric material in a liquid state; baking the first dielectric material to transform the first dielectric material from a liquid state to a solid state; after the baking, filling a rest of the trench with a second dielectric material; forming, using a plasma deposition process, a third dielectric material over the second dielectric material, wherein the third dielectric material is formed to have a thickness that is within about 20% and about 80% of a total thickness of the first dielectric material and the second dielectric material; forming, using a chemical vapor deposition process, a fourth dielectric material over the third dielectric material; etching an opening through the fourth dielectric material, the third dielectric material, the second dielectric material, and the first dielectric material, wherein the opening exposes at least a portion of the bonding pad; and coupling a carrier substrate to the device substrate, wherein the coupling includes inserting a protruding component of the carrier substrate through the opening and bonding the protruding component to the bonding pad.

Yet another aspect of the present disclosure pertains to a semiconductor device. The semiconductor device includes: a plurality of layers vertically stacked over one another; a trench extending vertically through the plurality of layers, wherein the trench is at least partially filled by a first dielectric layer that delivers a first tensile stress; a second dielectric layer disposed over the first dielectric layer, wherein the second dielectric layer delivers a second tensile stress or a first compressive stress; and a third dielectric layer disposed over the second dielectric layer, wherein the third dielectric layer delivers a second compressive stress.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
    forming a trench through a plurality of layers that are disposed over a first substrate;
    performing a first deposition process to at least partially fill the trench with a first dielectric layer, wherein the first dielectric layer delivers a tensile stress;
    performing a second deposition process to form a second dielectric layer over the first dielectric layer;
    performing a third deposition process to form a third dielectric layer over the second dielectric layer, wherein the third dielectric layer delivers a first compressive stress; and
    performing a fourth deposition process to form a fourth dielectric layer over the third dielectric layer, wherein the fourth dielectric layer delivers a second compressive stress.

2. The method of claim 1, wherein the forming the trench comprises forming the trench with an aspect ratio greater than or equal to about 10:1.

3. The method of claim 1, wherein:
    the first deposition process comprises a spin on dielectric deposition process to at least partially fill the trench with the first dielectric layer; and
    the first dielectric layer is in a liquid state during the spin on dielectric deposition process.

4. The method of claim 3, further comprising: performing an annealing process after the first deposition process but before the second deposition process, wherein the annealing process bakes the first dielectric layer to transform the first dielectric layer from the liquid state to a solid state.

5. The method of claim 1, wherein:
    the first deposition process partially fills the trench with the first dielectric layer; and
    the second deposition process completely fills a rest of the trench with the second dielectric layer.

6. The method of claim 1, wherein the third deposition process includes a plasma process.

7. The method of claim 1, wherein the third deposition process is performed such that a thickness of the third dielectric layer is in a range between about 20% and about 80% of a combined thickness of the first dielectric layer and the second dielectric layer.

8. The method of claim 1, wherein the fourth deposition process includes a plasma enhanced chemical vapor deposition (PECVD) process.

9. The method of claim 1, wherein:
    the first dielectric layer, the second dielectric layer, and the third dielectric layer are formed to each contain a silicon oxide material; and
    the fourth dielectric layer is formed to contain a silicon nitride material.

10. The method of claim 1, further comprising:
    forming a recess that extends through the first dielectric layer, the second dielectric layer, the third dielectric layer, and the fourth dielectric layer, wherein the recess exposes a conductive element formed in one of the plurality of layers;
    performing a bonding process with a second substrate, wherein the second substrate includes a protruding component that is inserted into the recess and bonded with the conductive element; and
    performing one or more etching processes to remove the first dielectric layer, the second dielectric layer, the third dielectric layer, and the fourth dielectric layer.

11. The method of claim 1, wherein second the compressive stress delivered by the fourth dielectric layer is in a range between about $-5.0 \times 10^9$ dyne/centimeter$^2$ and about $-2.0 \times 10^8$ dyne/centimeter$^2$.

12. The method of claim 1, wherein the fourth deposition process is performed such that a thickness of the fourth dielectric layer is in a range between about 50 nanometers and about 200 nanometers.

13. A method, comprising:
    forming a trench through a stack of layers that are disposed over a device substrate, wherein the trench has an aspect ratio greater than or equal to about 10:1, and wherein one of the layers of the stack contains a bonding pad;
    partially filling, using a spin on dielectric deposition process, the trench with a first dielectric material in a liquid state;
    baking the first dielectric material to transform the first dielectric material from the liquid state to a solid state;
    after the baking, filling a rest of the trench with a second dielectric material;
    forming, using a plasma deposition process, a third dielectric material over the second dielectric material, wherein the third dielectric material is formed to have a thickness that is within about 20% and about 80% of a total thickness of the first dielectric material and the second dielectric material;
    forming, using a chemical vapor deposition process, a fourth dielectric material over the third dielectric material;
    etching an opening through the fourth dielectric material, the third dielectric material, the second dielectric material, and the first dielectric material, wherein the opening exposes at least a portion of the bonding pad; and
    coupling a carrier substrate to the device substrate, wherein the coupling includes inserting a protruding component of the carrier substrate through the opening and bonding the protruding component to the bonding pad.

14. The method of claim 13, further comprising:
before the fourth dielectric material is formed, performing a chemical mechanical polishing (CMP) process to planarize a surface of the third dielectric material, wherein the fourth dielectric material is formed on the planarized surface of the third dielectric material; and
after the coupling, removing the first dielectric material, the second dielectric material, the third dielectric material, and the fourth dielectric material using one or more etching processes.

15. The method of claim 13, wherein:
the first dielectric material applies a first tensile stress;
the second dielectric material applies a second tensile stress less than the first tensile stress or a first compressive stress;
the third dielectric material applies a second compressive stress; and
the fourth dielectric material applies a third compressive stress.

16. A method, comprising:
forming a plurality of layers over a first substrate;
etching a recess through the plurality of layers;
least partially filling the recess with a first dielectric layer, wherein the first dielectric layer is in a liquid state and delivers a tensile stress;
annealing the first dielectric layer, thereby transforming the first dielectric layer from the liquid state to a solid state;
after the annealing, completely filling a rest of the recess with a second dielectric layer; and
forming a third dielectric layer over the second dielectric layer, wherein the third dielectric layer delivers a first compressive stress.

17. The method of claim 16, further comprising: forming a fourth dielectric layer over the third dielectric layer, wherein the fourth dielectric layer delivers a second compressive stress.

18. The method of claim 17, wherein:
the first dielectric layer is formed using a spin-on dielectric deposition process;
the third dielectric layer is formed using a plasma process; and
the fourth dielectric layer is formed using a plasma enhanced chemical vapor deposition (PECVD) process.

19. The method of claim 16, wherein the third dielectric layer is thinner than a combined thickness of the first dielectric layer and the second dielectric layer.

20. The method of claim 16, further comprising:
forming an opening through at least the second dielectric layer and the first dielectric layer, wherein the opening exposes a conductive feature formed in one of the plurality of layers;
performing a bonding process with a second substrate, wherein the second substrate includes a protruding component that protrudes into the opening and bonds with the conductive feature; and
after the bonding process is performed, removing the first dielectric layer and the second dielectric layer.

* * * * *